United States Patent [19]

Togashi et al.

[11] Patent Number: 4,793,130
[45] Date of Patent: Dec. 27, 1988

[54] THIN-METAL-WIRE CONJUGATED YARN

[75] Inventors: Takahiko Togashi; Tomotsugu Kanamura; Yoshiyuki Mori; Yoshinori Sato; Yasuji Inoue; Teruhiro Tsuchida, all of Nagoya, Japan

[73] Assignee: Mitsubishi Rayon Co., Ltd., Tokyo, Japan

[21] Appl. No.: 60,888

[22] Filed: Jun. 12, 1987

[30] Foreign Application Priority Data

Jun. 20, 1986 [JP] Japan .............................. 61-94090[U]
Jun. 20, 1986 [JP] Japan .............................. 61-94091[U]

[51] Int. Cl.$^4$ .......................... D02G 3/12; D02G 3/38
[52] U.S. Cl. .................................... 57/210; 57/901
[58] Field of Search ............... 57/210, 227, 228, 238, 57/901

[56] References Cited

U.S. PATENT DOCUMENTS

| | | | |
|---|---|---|---|
| 3,490,224 | 1/1970 | Bourgeas | 57/901 X |
| 3,582,444 | 6/1971 | Ngo | 57/238 X |
| 3,590,570 | 7/1971 | Okuhashi et al. | 57/238 |
| 3,699,590 | 10/1972 | Webber | 57/901 X |
| 3,722,440 | 3/1973 | Igarashi et al. | 57/901 X |
| 3,882,667 | 5/1975 | Barry | 57/901 |
| 4,154,881 | 5/1979 | Hirakawa | 57/227 X |
| 4,384,449 | 5/1983 | Byrnes | |
| 4,647,495 | 3/1987 | Kanagama et al. | 57/901 X |

FOREIGN PATENT DOCUMENTS

| | | | |
|---|---|---|---|
| 1043088 | 11/1978 | Canada | 57/901 |
| 1342986 | 10/1962 | France | . |
| 2018323 | 10/1975 | United Kingdom | . |

*Primary Examiner*—Donald Watkins
*Attorney, Agent, or Firm*—Armstrong, Nikaido, Marmelstein & Kubovcik

[57] ABSTRACT

Thin-metal-wire conjugated yarn excellent in suitability for clothing and having EMI shielding which comprises a core composed of a thin metal wire having a diameter of 50$\mu$ or less and a chemical or synthetic fiber or natural fiber yarn, and another chemical or synthetic fiber or natural fiber yarn as sheath wound round and coated on said core, characterized in that the coating percentage is 70% or more based on the surface area of the conjugated yarn.

7 Claims, 1 Drawing Sheet

THIN-METAL-WIRE CONJUGATED YARN

BACKGROUND OF THE INVENTION

This invention relates to thin-metal-wire conjugated yarn which is excellent in suitability for clothing, for example, feeling, appearance, color effect, etc. and has an electromagnetic interference (referred to as "EMI", hereinafter) shielding function.

Cloths for the purpose of EMI shielding include, for example, cloth obtained by plating the surface of cloth with metals such as nickel, copper, etc.; clothing for EMI shielding obtained by forming a metal plating layer on the surface of cloth which is disclosed, for example, in Japanese Utility Model Registration Unexamined Publication No. 61-64115; cloth made of spun yarn with metal short fiber blended; and cloth obtained by using gold thread or silver thread produced by winding gold leaf or silver leaf round carbon fiber as core thread which has been proposed i Japanese Utility Model Registration Unexamined Publication No. 61-2407.

However, the metal-plated cloth is limited in color to a single color characteristic of the metal used, is poor in feeling and appearance as clothing, is expensive, and is greatly lowered in EMI shielding effect with an increase of the frequency of use or washing.

In the case of the cloth obtained by using spun yarn with metal short fiber blended, the end of metal fiber juts out from the surface, so that unpleasant feeling is caused at the time of wearing. Furthermore, the tinsel such as gold and silver threads obtained by winding metallic leaf is disadvantageous in that it has a rough and hard feeling and is poor in suitability for clothing because the metallic leaf is produced by evaporating a metal on film-like substance, and hence the use of the tinsel is limited.

SUMMARY OF THE INVENTION

This invention is intended to solve these problems and provides yarn which is excellent particularly in suitability for clothing, for example in, feeling, appearance, color effect, durability, etc. and has EMI shielding effect.

This invention provides thin-metal-wire conjugated yarn comprising a core composed of a thin metal wire having a diameter of 50 $\mu$ or less and a chemical or synthetic fiber or natural fiber yarn, and another synthetic or chemical fiber or natural fiber yarn as a sheath wound round and covering said core, which is characterized in that the covering percentage is 70% or more based on the surface area of the conjugated yarn.

BRIEF DESCRIPTION OF THE DRAWINGS

The attached drawings are briefly explained below.

Figure 1:
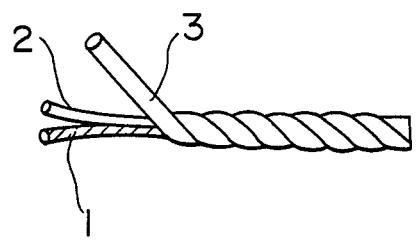
FIG. 1 is an exterior view of thin-metal-wire conjugated yarn of this invention obtained by means of a hollow-spindle type twister.

The numbers in the drawings show the following materials:

1: thin metal wire in core portion
2: chemical or synthetic fiber or natural fiber yarn in core portion
3 and 3': chemical or synthetic fiber or natural fiber yarn in sheath portion
4: thin-metal-wire conjugated yarn as warp
5: thin-metal-wire conjugated yarn as weft

DESCRIPTION OF THE PREFERRED EMBODIMENT

This invention is explained below in detail with reference to the above drawings.

As the thin metal wire (1) shown in FIG. 1, a thin wire of electrically conductive metal such as stainless steel, copper or the like is used, though good results can be obtained when there is used a thin wire made preferably of copper excellent in flexibility on the surface of which a layer has been baked in order to improve the rust-preventive effect. As a result of experiments, the diameter of the wire should be 50 $\mu$ or less, preferably about 20 to about 30 $\mu$. When it exceeds 50 $\mu$, no sufficient suitability for clothing can be attained, for example, the resulting conjugated yarn is poor in flexibility and hence difficult to process, and moreover cloth made of the conjugated yarn is rough and hard and is insufficient in recovery from deformation and draping properties.

On the other hand, a thin metal wire having a diameter of 50 $\mu$ or less should be reinforced with chemical or synthetic fiber or natural fiber yarn (2) because it involves, for example, the following problems: its strength is very low; when it is used alone as the core portion, the processability is unstable; and even when it can be made into conjugated yarn, it breaks in a process of processing into cloth.

As the thin metal wire, there is used one which has such an elongation of 15% or less as permits practical use of the wire. Such a thin metal wire is disadvantageous in that it is low in recovery from elongation, and therefore when there is required a step in which the conjugated yarn is subjected to excessive elongation, the thin metal wire in the core portion does not recover from the elongation and tends to jut out from the surface of the conjugated yarn.

Such a trouble can be prevented by using chemical or synthetic fiber or natural fiber yarn having an elongation of 10% or less, preferably 5% or less for forming the conjugated yarn.

The thin metal wire has a boiling water shrinkage percentage of substantially zero, and therefore when the boiling water shrinkage percentage of the chemical or synthetic fiber or natural fiber yarn forming the conjugated yarn is high, the thin metal wire tends to jut out from the surface layer of yarn in the sheath portion owing to heat treatment in a dyeing step or the like and injures the feeling and appearance of cloth made of the conjugated yarn. These defects can be prevented by using chemical or synthetic fiber or natural fiber yarn having a boiling water shrinkage percentage of 5% or less, preferably 3% or less.

Figure 2:
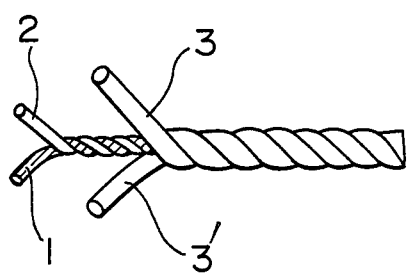
FIG. 2 is an exterior view of thin-metal-wire conjugated yarn of this invention obtained according to the example.

Furthermore, the thin metal wire (1) and the chemical or synthetic fiber or natural fiber yarn (2) both constituting the core portion may be in doubled state, though when they are twisted together as shown in FIG. 2, conjugated yarn more stable to the problems described above can be obtained.

The percentage of covering with the chemical or synthetic fiber or natural fiber yarn (3) forming the sheath portion is adjusted to 70% or more, preferably 90% or more based on the surface area of the conjugated yarn, whereby it becomes possible to obtain a usual, sufficient dyeing effect and the conjugated yarn permits, as yarn for clothing, free selection of its color tone and can have a feeling suitable for clothing.

Figure 3:
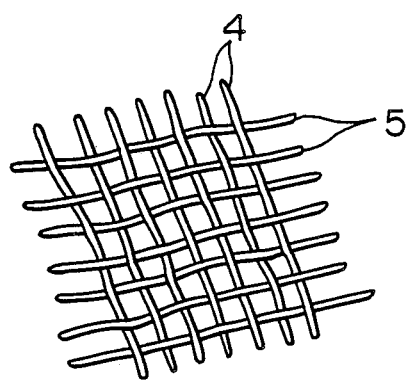
FIG. 3 is a model-like enlarged top plan view of one example of this invention.

FIG. 3 is a model-like enlarged top plan view of one example of fabric of this invention. In FIG. 3, both the warp (4) and the weft (5) are metal-thin-wire conjugated yarn, and a plain weave fabric produced therefrom is shown.

Cloth having a good EMI shielding function can be obtained by weaving the conjugated yarn in the lengthwise and crosswise directions at a density of 40 or more per inch, preferably 60 or more per inch.

That is to say, in the case of the mesh structure of, for example, fabric, higher the density at which the thin-metal-wire conjugated yarn is woven in the lengthwise and crosswise directions, the more effective EMI shielding function, and therefore the smaller diameter of the thin metal wire in the core portion is more advantageous.

Although the textile weave is not critical, a more desirable result can be obtained when the textile weave is one which has a denser and more uniform mesh structure and more nodes, such as plain weave, twill weave, satin weave, or the like.

The results of rating the effect obtained by employing various textile weaves and densities are shown in the following table.

| Textile weave | Warp | Weft | Density (warp × weft) | Attenuation 1000 MHZ (dB) | Rating of effect |
|---|---|---|---|---|---|
| Plain weave | A | A | 80/inch × 80/inch | 45 | ◎ |
|  | A | A | 60 × 60 | 36 | ◎ |
|  | A | A | 40 × 40 | 30 | ○ |
|  | A | A | 30 × 30 | 20 | △ |
|  | B | B | 80 × 80 | 30 | ○ |
|  | C | A | 80 × 80 | 3 | x |
| Twill weave | A | A | 80 × 80 | 38 | ◎ |
| Satin weave | A | A | 80 × 80 | 36 | ◎ |

A ... conjugated yarn of this invention produced according to the example described below.
B ... the conjugated yarn and polyester filament 150D/48F which were arranged in the manner of 1 × 1.
C ... polyester filament 150D/48F.

Next, as to a process for producing the thin-metal-wire conjugated yarn of this invention, the conjugated yarn can be produced by means of a ring twister having an overfeeding mechanism or a hollow-spindle type twister. The number of the yarns used for producing the conjugated yarn is not limited to one but may be two or more depending on purposes.

It is possible to obtain cloth by means of a conventional weaving machine such as fly shuttle loom, rapier loom, or the like by using the conjugated yarn.

EXAMPLE

A thin copper wire having a diameter of 24 μ and a piece of polyester filament yarn 30d/24f were doubled, and using them as core portion and two pieces of polyester filament false-twisted yarn 75d/36f as sheath portion, covering twisting was conducted under the conditions described below to obtain thin-metal-wire conjugated yarn having a covering percentage of about 90% and a sufficient flexibility. Further, the conjugated yarn was made into plain weave having warp and weft densities of 80/inch each, whereby there could be obtained cloth which was good in processability and dyeability, had sufficient feeling and appearance for clothing, and was excellent in EMI shielding function.

Twister: a ring twister
Rotation rate: 7,200 r.p.m.
Number of twist: 400 t/m
Tension of yarn in the core portion: 35 g
Overfeeding percentage of yarn in the sheath portion: 4%

EFFECT OF THE INVENTION

This invention, by virtue of its constitution described above, provides yarn and cloth which have both EMI shielding function and suitability for use in clothing such as desirable color, appearance, feeling, durability, etc., and can be used in various ways in which sufficient fashionability is added to clothes such as working clothes, uniforms, white robes and the like, curtains, wall materials, etc. all for preventing EMI. Thus, this invention has great industrial effects.

What is claimed is:

1. A thin-metal-wire conjugated yarn comprising a core portion composed of a thin metal wire having a diameter of 50 μ or less and a chemical or synthetic fiber or natural fiber yarn, and another chemical or synthetic fiber or natural fiber yarn as a sheath wound round and covering said core, the covering percentage being 70% or more based on the surface area of the conjugated yarn.

2. A thin-metal-wire conjugated yarn according to claim 1, wherein the thin metal wire constituting the core portion is made of copper and a layer of polyurethane has been baked onto its surface.

3. A thin-metal-wire conjugated yarn according to claim 1, wherein the elongation of the thin metal wire constituting the core portion is 15% or less.

4. A thin-metal-wire conjugated yarn according to claim 1, wherein the elongation of the chemical or synthetic fiber or natural fiber yarn forming the conjugated yarn is 10% or less.

5. A thin-metal-wire conjugated yarn according to claim 1, wherein the boiling water shrinkage of the chemical or synthetic fiber or natural fiber yarn forming the conjugated yarn is 5% or less.

6. A thin-metal-wire conjugated yarn according to claim 1, wherein the yarn constituting the core portion is a twisted yarn.

7. A thin-metal-wire conjugated yarn according to claim 1, wherein the covering percentage is 90% or more.

* * * * *